(12) United States Patent
Seo et al.

(10) Patent No.: US 9,171,865 B2
(45) Date of Patent: Oct. 27, 2015

(54) FLAT PANEL DISPLAY APPARATUS AND METHOD FOR MANUFACTURING THE FLAT PANEL DISPLAY APPARATUS

(71) Applicant: Samsung Display Co., Ltd., Yongin, Gyeonggi-Do (KR)

(72) Inventors: Il-Hun Seo, Yongin (KR); Jong-Hyun Choi, Yongin (KR); Byung-Soo So, Yongin (KR); Yong-Duck Son, Yongin (KR); Jin-Wook Seo, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/061,359

(22) Filed: Oct. 23, 2013

(65) Prior Publication Data
US 2014/0353669 A1    Dec. 4, 2014

(30) Foreign Application Priority Data

May 29, 2013  (KR) ........................ 10-2013-0061254

(51) Int. Cl.
| H01L 27/14 | (2006.01) |
| H01L 31/036 | (2006.01) |
| H01L 21/00 | (2006.01) |
| H01L 27/12 | (2006.01) |

(52) U.S. Cl.
CPC .......... *H01L 27/124* (2013.01); *H01L 27/1259* (2013.01)

(58) Field of Classification Search
USPC ............................................ 257/72; 438/151
See application file for complete search history.

(56) References Cited

U.S. PATENT DOCUMENTS

| 7,612,836 B2* | 11/2009 | Park et al. ........................ 349/39 |
| 7,830,476 B2* | 11/2010 | Park ................................. 349/69 |
| 8,106,402 B2 | 1/2012 | Yeo et al. |
| 8,686,409 B2* | 4/2014 | Lee et al. ......................... 257/40 |
| 8,698,189 B2* | 4/2014 | Park et al. ........................ 257/99 |
| 2002/0151119 A1* | 10/2002 | Kim et al. ..................... 438/154 |
| 2006/0108587 A1* | 5/2006 | Lee et al. ......................... 257/72 |
| 2010/0068841 A1* | 3/2010 | Park et al. ....................... 438/30 |
| 2010/0090594 A1* | 4/2010 | Choi et al. ..................... 313/506 |
| 2013/0001563 A1* | 1/2013 | Park et al. ........................ 257/59 |
| 2013/0119388 A1* | 5/2013 | Lee et al. ......................... 257/59 |
| 2013/0146878 A1* | 6/2013 | Oh et al. .......................... 257/59 |
| 2013/0320314 A1* | 12/2013 | Kim et al. ......................... 257/40 |

FOREIGN PATENT DOCUMENTS

| KR | 10-2004-0037889 | 5/2004 |
| KR | 10-2010-0088269 | 8/2010 |
| KR | 10-2012-0090190 | 8/2012 |

* cited by examiner

*Primary Examiner* — Matthew Landau
*Assistant Examiner* — Igwe U Anya
(74) *Attorney, Agent, or Firm* — Innovation Counsel LLP

(57) ABSTRACT

A display apparatus includes an active layer that overlaps a substrate and comprises a channel region. The display apparatus further includes an insulating layer disposed on the substrate and the active layer. The display apparatus further includes a gate electrode disposed on the insulating layer, overlapping the channel region, and comprising a first gate electrode layer and a second gate electrode layer, wherein the first gate electrode layer is formed of a first material and is disposed between the insulating layer and the second electrode layer, and wherein the second gate electrode layer is formed of a second material that is different from the first material. The display apparatus further includes a contact portion disposed on the insulating layer and comprising a first contact layer that is formed of the first material. The display apparatus further includes a pixel electrode that contacts the first contact layer.

29 Claims, 10 Drawing Sheets

FLAT PANEL DISPLAY APPARATUS AND METHOD FOR MANUFACTURING THE FLAT PANEL DISPLAY APPARATUS

CROSS-REFERENCE TO RELATED PATENT APPLICATION

This application claims the benefit of Korean Patent Application No. 10-2013-0061254, filed on May 29, 2013, in the Korean Intellectual Property Office, the disclosure of which is incorporated herein in its entirety by reference.

BACKGROUND

1. Field

The present disclosure relates to a flat panel display apparatus and a method for manufacturing the flat panel display apparatus.

2. Description of the Related Art

Flat panel display apparatuses may include organic light emitting display apparatuses, liquid crystal display (LCD) apparatuses, and so on. Typically, manufacturing of a flat panel display apparatus may involve forming a plurality of components on a substrate. The components may include thin film transistors, capacitors, and wirings that are electrically connected to the thin film transistors and/or the capacitors. In general, patterns that include thin film transistors, capacitors, and/or wiring may be transferred onto a substrate using masks. Manufacturing of a large-size and/or high-resolution display apparatus may require many masks and/or many mask process steps. Therefore, the manufacturing cost for the display apparatus may be undesirably high.

SUMMARY

An embodiment of the invention may be related to a display apparatus that includes a substrate. The display apparatus may further include an active layer overlapping the substrate and comprising a channel region, a source region, and a drain region. The display apparatus may further include a first insulating layer disposed on the substrate and the active layer. The display apparatus may further include a gate electrode disposed on the first insulating layer, overlapping the channel region, and comprising a first gate electrode layer and a second gate electrode layer, wherein the first gate electrode layer is formed of a first material and is disposed between the first insulating layer and the second electrode layer, and wherein the second gate electrode layer is formed of a second material that is different from the first material. The display apparatus may further include a contact portion disposed on the first insulating layer and comprising a first contact layer that is formed of the first material. The display apparatus may further include a second insulating layer disposed on the gate electrode and the contact portion and comprising a first contact hole, a second contact hole, and a third contact hole, wherein the first contact hole exposes a portion of the source region, wherein the second contact hole exposes a portion of the drain region, and wherein the third contact hole exposes a portion of the first contact layer. The display apparatus may further include a source electrode formed on the second insulating layer and contacting the source region via the first contact hole. The display apparatus may further include a drain electrode formed on the second insulating layer and contacting the drain region via the second contact hole. The display apparatus may further include a pixel electrode formed on the second insulating layer and contacting the first contact layer via the third contact hole.

The contact portion may further include a second contact layer formed of the second material, disposed on the first contact layer, and exposing the portion of the first contact layer.

One of the source electrode and the drain electrode may be electrically connected to the contact portion.

The second insulating layer may further include a fourth contact hole, the fourth contact hole exposing a portion of the contact portion. One of the source electrode and the drain electrode may directly contact the contact part via the fourth contact hole.

A portion of the pixel electrode may directly contact a portion of one of the source electrode and the drain electrode. The portion of the one of the source electrode and the drain electrode may be disposed between the second insulating layer and the portion of the pixel electrode.

The pixel electrode directly may contact and cover a side of the one of the source electrode and the drain electrode that is not parallel to a bottom surface of the substrate.

The display apparatus may include the following elements: a third insulating layer formed on the second insulating layer and comprising an opening through, the opening exposing at least a part of the pixel electrode; an intermediate layer formed on the part of the pixel electrode and comprising an emissive layer; and an opposite electrode facing the pixel electrode, wherein the intermediate layer is interposed between the pixel electrode and the opposite electrode.

The part of the pixel electrode may be disposed between the emissive layer and the second insulating layer.

Edges of the first gate electrode may coincide with edges of the second gate electrode.

The display apparatus of claim 1 may include a buffer layer formed between the substrate and the active layer.

The first contact layer may include at least one of an indium tin oxide (ITO), an indium zinc oxide (IZO), a zinc oxide (ZnO), an indium oxide ($In_2O_3$), an indium gallium oxide (IGO), and an aluminum zinc oxide (AZO).

The active layer may be formed of polysilicon.

The pixel electrode may include a metal layer interposed between two indium tin oxide (ITO) layers.

At least one edge of the contact portion (e.g., an edge of the second contact layer) may be exposed by the third contact hole.

An embodiment of the invention may be related to a method for manufacturing a display apparatus. The method may include the following steps: forming a semiconductor layer that overlaps a substrate; forming an active layer by patterning the semiconductor layer; sequentially forming a first insulating layer, a first conductive layer, and a second conductive layer that overlap the active layer and the substrate, wherein in the first conductive layer is formed of a first material, and wherein the second conductive layer is formed of a second material that is different from the first material; simultaneously patterning the first conductive layer and the second conductive layer to form a gate electrode and a contact portion that is spaced from the gate electrode, wherein the gate electrode comprises a first gate electrode layer and a second gate electrode layer, wherein the contact portion comprises a first contact layer and a second contact layer, wherein the first gate electrode layer and the first contact layer are formed of the first material, and wherein the second gate electrode layer and the second contact layer are formed of the second material; using the gate electrode as a mask to form a source region and a drain region at edges of the active layer; forming a second insulating layer that overlaps the gate electrode, the contact portion, and the first insulating layer; patterning the second insulating layer to form a first contact hole, a second contact hole, and a third contact hole, wherein the first contact hole exposes a portion of the source region, wherein the second contact hole exposes a portion of the drain region, and wherein the third contact hole exposes at least a part of the contact portion;

forming a third conductive layer that overlaps the second insulating layer; patterning the third conductive layer to form a source electrode that contacts the source region through the first contact hole and to form a drain electrode that contacts the drain region through the second contact hole; forming a fourth conductive layer that overlaps the second insulating layer; and; patterning the fourth conductive layer to form a pixel electrode.

The method may include removing at least a part of the second contact layer during the patterning the third conductive layer to expose at least a portion of the first contact layer, wherein the pixel electrode may directly contact the portion of the first contact layer through the third contact hole.

The third contact hole may expose at least one edge of the contact portion.

The method may include forming a buffer layer on the substrate.

One of the source electrode and the drain electrode may be electrically connected to and may directly contact the contact portion.

The step of patterning the second insulating layer may include forming a fourth contact hole that exposes a portion of the second contact layer. One of the source electrode and the drain electrode may directly contact the second contact layer via the fourth contact hole.

A portion of the pixel electrode may directly contact a portion of one of the source electrode and the drain electrode. The portion of the one of the source electrode and the drain electrode may be disposed between the second insulating layer and the portion of the pixel electrode.

The pixel electrode may directly contact and cover a side of the one of the source electrode and the drain electrode that is not parallel to a bottom surface of the substrate.

The method may include the following steps: forming a third insulating layer that overlaps the pixel electrode; and patterning the third insulating layer to form an opening that exposes a part of the pixel electrode is exposed.

The method may include the following steps: forming an intermediate layer comprising an emissive layer on the part of the pixel electrode; and forming an opposite electrode that overlaps the pixel electrode, wherein the intermediate layer is interposed between the pixel electrode and the opposite electrode.

The part of the pixel electrode may be disposed between the emissive layer and the second insulating layer.

Edges of the first gate electrode may coincide with edges of the second gate electrode.

The first conductive layer may include and/or may be formed of at least one of an indium tin oxide (ITO), an indium zinc oxide (IZO), a zinc oxide (ZnO), an indium oxide ($In_2O_3$), an indium gallium oxide (IGO), and an aluminum zinc oxide (AZO).

The fourth conductive layer may include a metal layer interposed between indium tin oxide (ITO) layers.

DETAILED DESCRIPTION

Figure 1:
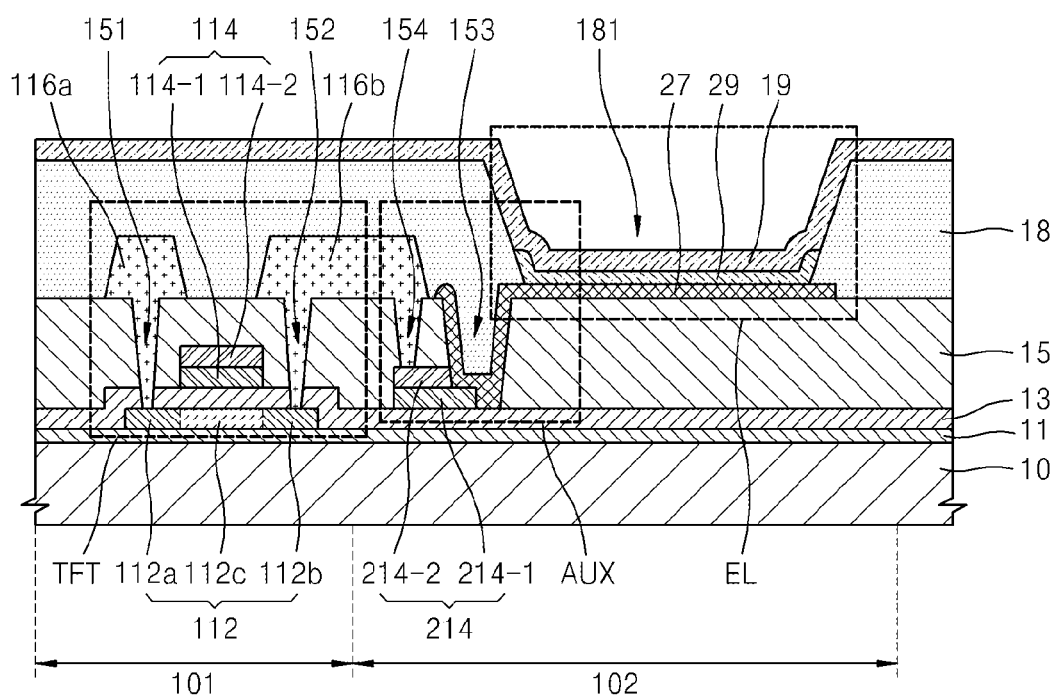
FIG. 1 is a cross-sectional view schematically illustrating a part of a flat panel display apparatus according to an embodiment of the present invention.

Particular embodiments are illustrated in the drawings and described in detail in the written description. The embodiments are not intended to limit the invention to particular modes of practice. All changes, equivalents, and substitutes that do not depart from the spirit and technical scope of the invention are encompassed in the invention.

Although the terms first, second, etc. may be used herein to describe various signals, elements, components, regions, layers, and/or sections, these signals, elements, components, regions, layers, and/or sections should not be limited by these terms. These terms may be used to distinguish one signal, element, component, region, layer, or section from another signal, region, layer, or section. Thus, a first signal, element, component, region, layer, or section discussed below may be termed a second signal, element, component, region, layer, or section without departing from the teachings of the present invention. The description of an element as a "first" element may not require or imply the presence of a second element or other elements. The terms first, second, etc. may also be used herein to differentiate different categories of elements. For conciseness, the terms first, second, etc. may represent first-type (or first-category), second-type (or second-category), etc., respectively.

The terms used in the present specification are used to describe particular embodiments without limiting the present invention. An expression used in a singular form may encompass an expression of a plural form. The terms "including", "having," etc., may indicate the existence of the recited features, numbers, steps, actions, components, parts, or combinations without excluding the possibility that one or more other features, numbers, steps, actions, components, parts, or combinations may exist or may be added.

The term "and/or" may include any and all combinations of one or more of the listed items.

The term "connected" may mean "electrically connected".

FIG. 1 is a cross-sectional view schematically illustrating a part of a flat panel display apparatus according to an embodiment of the present invention.

Referring to FIG. 1, the flat panel display apparatus includes a thin film transistor region 101 and a light emitting device region 102. Although not shown, the flat panel display apparatus may further include a capacitor region and may further include one or more other thin film transistor regions and/or one or more other light emitting device regions. The flat panel display apparatus includes a substrate 10, a thin film transistor TFT that overlaps the substrate 10, and an organic light emitting device EL that overlaps the substrate 10. The flat panel display apparatus may further include a buffer layer 11 that is disposed on the substrate 10 for protecting the substrate 10 and/or for planarizing a top surface of the substrate 10.

The thin film transistor TFT is disposed in the thin film transistor region 101. The thin film transistor TFT may serve as a driving device and/or a switching device. The thin film transistor TFT includes an active layer 112 that is formed on the buffer layer 11. The thin film transistor TFT includes a channel region 112c, a source region 112a, and a drain region 112b, which may directly contact the buffer layer 11, wherein the channel region 112c may be disposed between the source region 112a and the drain region 112b. The thin film transistor TFT may further include a portion of a first insulating layer 13, which may overlap the substrate 10 and the active layer 112. The thin film transistor TFT may further include a gate electrode 114 that is formed on the first insulating layer 13. The gate electrode 114 includes a first gate electrode 114-1 and a second gate electrode 114-2 that are sequentially formed and overlap the channel region 112c. A width of the first gate electrode 114-1 and/or a width of the second electrode 114-2 may be substantially equal to a width of the channel region 112c. The thin film transistor TFT may further include a source electrode 116a that is connected to the source region 112a. The thin film transistor TFT may further include a drain electrode 116b that is connected to the drain region 112b.

The first gate electrode 114-1 may include at least one of an indium tin oxide (ITO), an indium zinc oxide (IZO), a zinc oxide (ZnO), an indium oxide ($In_2O_3$), an indium gallium oxide (IGO), and an aluminum zinc oxide (AZO). In an embodiment, a material used in forming the first gate electrode 114-1 may include a metal that is not etched in an etching method used for forming the source electrode 116a and/or the drain electrode 116b.

The second gate electrode 114-2 is formed on the first gate electrode 114-1 and is formed of at least a material that is different from the material(s) of the first gate electrode 114-1 and the second gate electrode 114-2. Edges of the first gate electrode 114-1 may be substantially aligned with edges of the second gate electrode 114-2.

The active layer 112 may be formed of polysilicon formed by crystallizing amorphous silicon and/or may be formed of one or more other materials. The source region 112a and the drain region 112b may include impurities having high concentration.

The display apparatus may include a second insulating layer 15 that substantially covers the gate electrode 114 and substantially overlaps the first insulating layer 13.

The organic light emitting device EL is disposed in the light emitting device region 102. The organic light emitting device EL is electrically connected to the thin film transistor TFT. The organic light emitting device EL includes a pixel electrode 27, an opposite electrode 19 (or common electrode 19) that overlaps the pixel electrode 27 (and overlaps other pixel electrodes of the display apparatus), and an intermediate layer 29 interposed between the pixel electrode 27 and the opposite electrode 19. A third insulating layer 18, which may be configured for defining at least a pixel, is formed on the second insulating layer 15 and includes an opening 181 through which at least a part of the pixel electrode 27 is exposed. The intermediate layer 29 is formed on the part of the pixel electrode 27 exposed through the opening 181 and includes an emissive layer (EML).

In an embodiment, the organic light emitting device EL is a bottom emission device such that light is emitted toward (and through) the substrate 10, the pixel electrode 27 may be a light transmission electrode, and the opposite electrode 19 may be a light reflection electrode. In an embodiment, the pixel electrode 27 is formed of a transparent conductive oxide (TCO). In an embodiment, the organic light emitting device EL is a top emission device such that light is emitted through the opposite electrode 19, the pixel electrode 27 may be a light reflection electrode including a semitransparent metal layer, and the opposite electrode 19 may be a light transmission electrode. In an embodiment, the organic light emitting device EL may be a dual emission device such that light is emitted through the substrate 10 and through the opposite electrode 19.

An auxiliary contact unit AUX that electrically connects the thin film transistor TFT and the organic light emitting device EL is formed in the light emitting device region 102. The auxiliary contact unit AUX electrically may include a contact portion 214 that electrically connects the thin film transistor TFT and the organic light emitting device EL. The contact portion 214 includes a first contact layer 214-1 and a second contact layer 214-2, which are formed on the first insulating layer 13. The first contact layer 214-1 is formed using the same layer of material(s) used in forming the first gate electrode 114-1. The material(s) of the first contact layer 214-1 may be substantially analogous to or same us the material(s) of the first gate electrode 114-1. The second contact layer 214-2 is formed using the same layer of material(s) used in forming the second gate electrode 114-2. The material(s) of the second contact layer 214-2 is may be substantially analogous to or same us the material(s) of the second gate electrode 114-2. The second contact layer 214-2 may partially cover the first contact layer 214-1 and may expose a portion of the first contact layer 214-1.

The second insulating layer 15 is interposed between the gate electrode 114 and the source electrode 116a and/or is interposed between the gate electrode 114 and the drain electrode 116b. The second insulating layer 15 includes a first contact hole 151 and a second contact hole 152, through which a portion of the source region 112a and a portion of the drain region 112b are exposed. The second insulation layer 15 further includes a third contact hole 153, through which a portion of the first contact layer 214-1 is exposed. The second insulating layer 15 may further include a fourth contact hole 154, through which a portion of the second contact layer 214-2 is exposed.

The third contact hole 153 may expose at least one edge (and/or at least one layer) of the contact portion 214. In an embodiment, the fourth contact hole 154 may be omitted or may be combined with the third contact hole 153. In an embodiment, the third contact hole 153 may expose both edges (and/or both layers) of the contact portion 214. In an embodiment, a width of the third contact hole 153 may be equal to or greater than a width of the contact portion 214.

The source electrode 116a and the drain electrode 116b are disposed on the second insulating layer 15 and contact the source region 112a and the drain region 112b through the first contact hole 151 and the second contact hole 152, respectively. The pixel electrode 27 is disposed on the second insulating layer 15 and contacts the first contact layer 214-1 through the third contact hole 153.

Since the contact portion 214 is electrically connected to the thin film transistor TFT, the pixel electrode 27 is electrically connected to the thin film transistor TFT via the contact portion 214. Although not shown in FIG. 1, the pixel electrode 27 may further include a portion that directly contacts one of the source electrode 116a and the drain electrode 116b. For example, the pixel electrode 27 may cover at least an edge of one of the source electrode 116a and the drain electrode 116b, thereby contacting one of the source electrode 116a and the drain electrode 116b. The edge of one of the source electrode 116a and the drain electrode 116b may be disposed between the portion of the pixel electrode 27 and the second insulating layer 15.

The contact portion 214 is electrically connected to the thin film transistor (TFT). For example, one of the source electrode 116a and the drain electrode 116b may contact the second contact layer 214-2 through the fourth contact hole 154. In an embodiment, one of the source electrode 116a and the drain electrode 116b may contact the contact portion 214 (e.g., may contact at least one of the first contact layer 214-1 and the second contact layer 214-2) through the third contact hole 153, and the fourth contact hole 154 may be omitted.

The flat panel display apparatus according to an embodiment of the present invention may be a bottom emission apparatus such that light is emitted in through the substrate 10. The display apparatus may have a metal mirror resonance structure. For example, the pixel electrode 27 may include a metal layer interposed between ITO layers, thereby implementing a metal mirror.

FIGS. 2 through 15 are cross-sectional views schematically illustrating a method for manufacturing the flat panel display apparatus illustrated in FIG. 1 according to an embodiment of the present invention.

Figure 2:
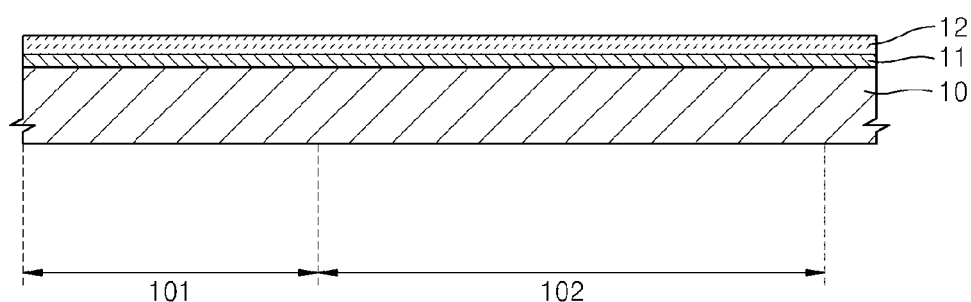
FIGS. 2 through 15 are cross-sectional views schematically illustrating a method for manufacturing a flat panel display apparatus according to an embodiment of the present invention.

Referring to FIG. 2, a buffer layer 11 and a semiconductor layer 12 are sequentially formed on a substrate 10. The substrate 10 may be formed of a transparent glass material, the main component of which is $SiO_2$. In an embodiment, the substrate 10 may be formed of one of various materials including plastic, metal, etc.

The buffer layer 11 may be disposed on a top surface of the substrate 10 so as to prevent impurity ions from diffusing into the substrate 10, to prevent moisture or air outside the flat panel display apparatus from permeating the substrate 10, and/or to planarize the surface of the substrate 10. The buffer layer 11 may include $SiO_2$ and/or $SiN_x$.

The semiconductor layer 12 is deposited on the buffer layer 11. The semiconductor layer 12 may be amorphous silicon or polysilicon. In an embodiment, polysilicon may be formed by crystallizing amorphous silicon. Amorphous silicon may be crystallized using one of various methods, such as a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method.

The buffer layer 11 and the semiconductor layer 12 may be deposited using one of various deposition methods, such as a plasma enhanced chemical vapor deposition (PECVD) method, an atmospheric pressure CVD (APCVD) method, and a low pressure CVD (LPCVD). In an embodiment, the buffer layer 11 may be omitted.

In an embodiment, the semiconductor layer 12 is formed of polysilicon. For forming the semiconductor layer 12, an amorphous silicon layer may be deposited on the buffer layer 11, and the amorphous silicon layer may be crystallized using an ELA method, an SLS method, or an MIC method.

Figure 3:
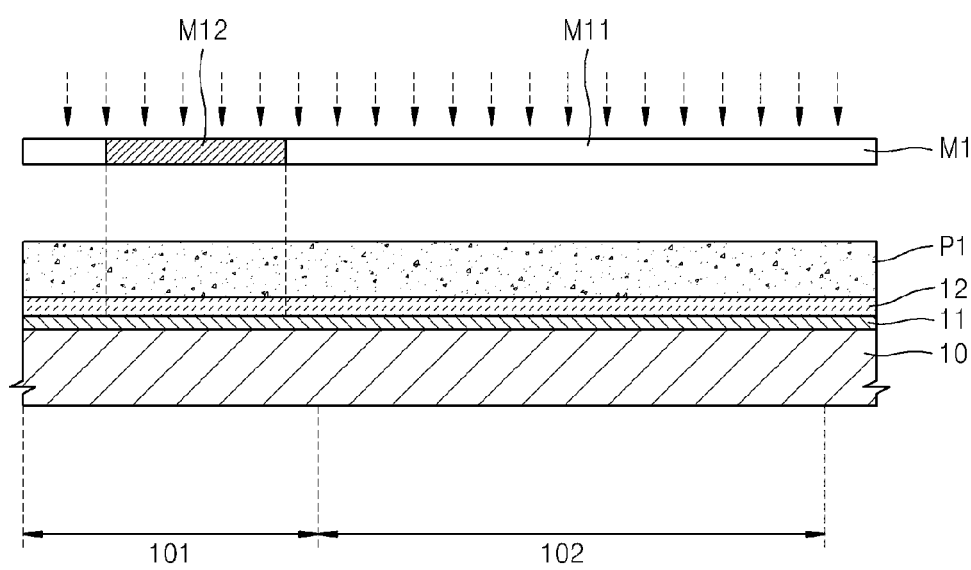

Referring to FIG. 3, a first photoresist P1 is applied onto the semiconductor layer 12, and a first mask process using a first mask M1 that includes a light transmission portion M11 and a light shielding portion M12 is performed. Although not specifically shown, after an exposure process is performed using the first photomask M1 and an exposure device (not shown), a series of processes, such as developing, etching, and stripping or ashing, are performed.

A positive-photoresist (PR), with which a portion exposed to light is removed, may be used as the first photoresist P1 in an embodiment. In an embodiment, a negative-PR may be used as the first photoresist P1.

Figure 4:
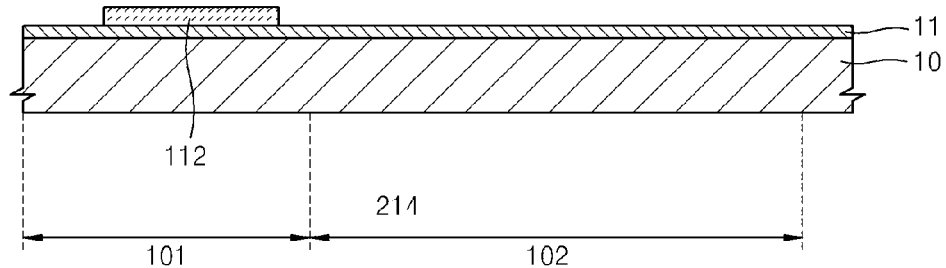

Referring to FIG. 4, as a result of performing the first mask process, the semiconductor layer 12 is patterned as an active layer 112 for subsequently forming the thin film transistor TFT.

Figure 5:
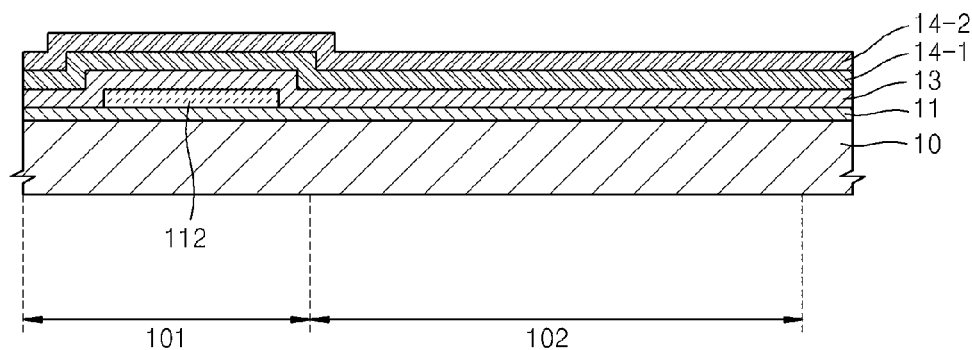

Referring to FIG. 5, a first insulating layer 13, a first conductive layer 14-1, and a second conductive layer 14-2 are sequentially stacked on the entire surface of the substrate 10, on which the active layer 112 is formed, and on the active layer 112.

The first insulating layer 13 may be formed by depositing an inorganic insulating layer, such as SiOx or $SiN_x$, using PECVD, APCVD, LPCVD, or ERC. The first insulating layer 13 may be formed as a single layer or a plurality of layers and may serve as a gate insulating layer for the thin film transistor TFT.

The first conductive layer 14-1 may be a transparent conductive layer. For example, the first conductive layer 14-1 may include at least one of an indium tin oxide (ITO), an indium zinc oxide (IZO), a zinc oxide (ZnO), an indium oxide ($In_2O_3$), an indium gallium oxide (IGO), an aluminum zinc oxide (AZO), etc.

In an embodiment, a material used in forming the first conductive layer 14-1 may include a metal. For example, the first conductive layer 14-1 may include titanium (Ti).

The second conductive layer 14-2 may have a single layer structure formed of a material that includes at least one of aluminum (Al), platinum (Pt), palladium (Pd), silver (Ag), magnesium (Mg), gold (Au), nickel (Ni), neodymium (Nd), iridium (Ir), chrome (Cr), nickel (Li), calcium (Ca), molybdenum (Mo), titanium (Ti), tungsten (W), copper (Cu), etc. The second conductive layer 14-2 may have a two-layer structure formed of two low-resistance materials, such as Mo and Al, or Mo and Ag, so as to reduce a wiring resistance. The second conductive layer 14-2 may have a multi-layer structure that includes two or more layers. For example, the second conductive layer 14-2 may be a stacked structure that consists of an Mo layer, an Al, layer, and an Mo layer; a stacked structure that consists of an MoW layer, an Al—Nd layer, and an MoW layer; a stacked structure that consists of a Ti layer, an Al layer, and a Ti layer; a stacked structure that consists of a Mo layer, an Ag layer, and an Mo layer; or a stacked structure that consists of an Mo layer, an Ag-alloy layer, and an Mo layer.

In one or more embodiments, each of the first conductive layer 14-1 and the second conductive layer 14-2 may be formed of one or more various materials and may have a single-layer structure or a multi-layer structure.

Figure 6:
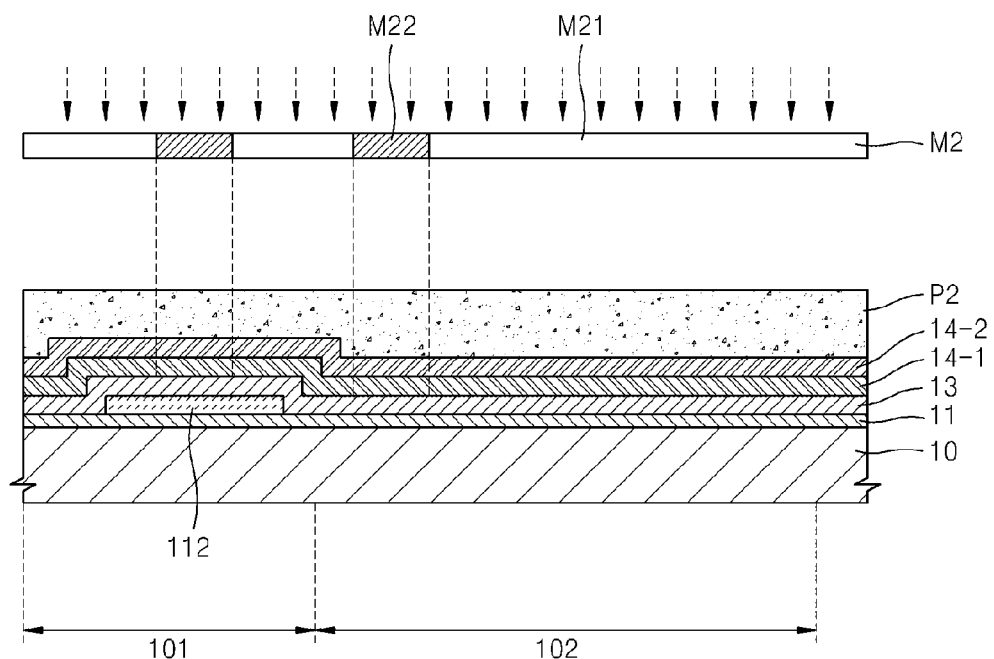

Referring to FIG. 6, a second photoresist P2 is applied onto the second conductive layer 14-2, and a second mask process using a second photomask M2 that includes a light transmission portion M21 and a light shielding portion M22 is performed.

Figure 7:
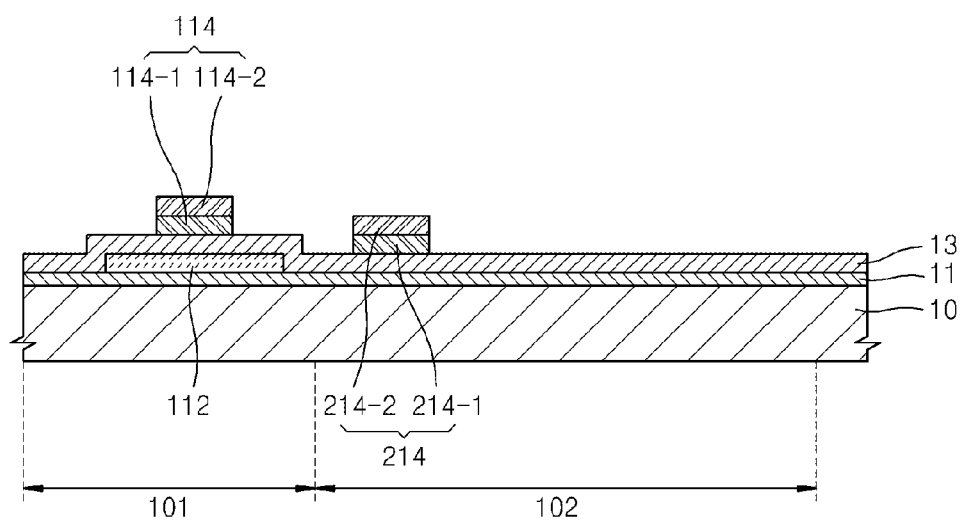

Referring to FIG. 7, as a result of performing the second mask process, the first conductive layer 14-1 and the second conductive layer 14-2 are etched so that a gate electrode 114 may be formed in a thin film transistor region 101 and that a contact portion 214 may be formed in a light emitting device region 102. The gate electrode 114 has a structure in which a first gate electrode 114-1 and a second gate electrode 114-2 are stacked, and the contact portion 214 has a structure in which a first contact layer 214-1 and a second contact layer 214-2 are stacked, wherein the contact portion 214 is spaced apart from the gate electrode 114 by a predetermined gap.

The first conductive layer 14-1 and the second conductive layer 14-2 are simultaneously patterned through the same mask process. The first conductive layer 14-1 is patterned to form the first gate electrode 114-1 in the thin film transistor region 101 and to form the first contact layer 214-1 in the light emitting device region 102. The second conductive layer 14-2 is patterned to form the second gate electrode 114-2 in the thin film transistor region 101 and to form the second contact layer 214-2 of the light emitting device region 102. The gate electrode 114 is formed to correspond to the center of the active layer 112.

Since the gate electrode 114 in the thin film transistor region 101 and the contact portion 214 in the light emitting device region 102 have been simultaneously patterned using the same mask M2 in the same structure, they are formed of the same material on the same layer. Since the first conductive layer 14-1 and the second conductive layer 14-2 have been simultaneously patterned using one mask M2, edges of the first gate electrode 114-1 may be substantially aligned with and/or may coincide with edges of the second gate electrode 114-2, and edges of the first contact layer 214-1 may be substantially aligned with and/or may coincide with edges of the second contact layer 214-2.

Figure 8:
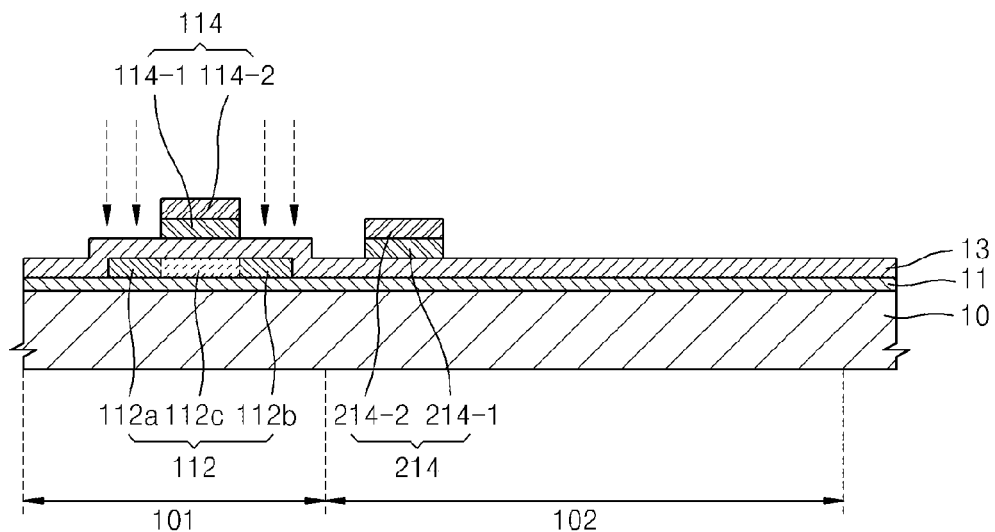

Referring to FIG. 8, ion impurities are doped into the active layer 112 using the gate electrode 114 as a self-aligned mask. As a result, the active layer 112 includes a source region 112a, a drain region 112b, and a channel region 112c interposed between the source region 112a and the drain region 112b, wherein the source region 112a, the drain region 112b, and the channel region 112c are formed on the same layer. The gate electrode 114 is used as a self-aligned mask such that the regions 112a and 112b may be formed without using an additional photomask.

Figure 9:
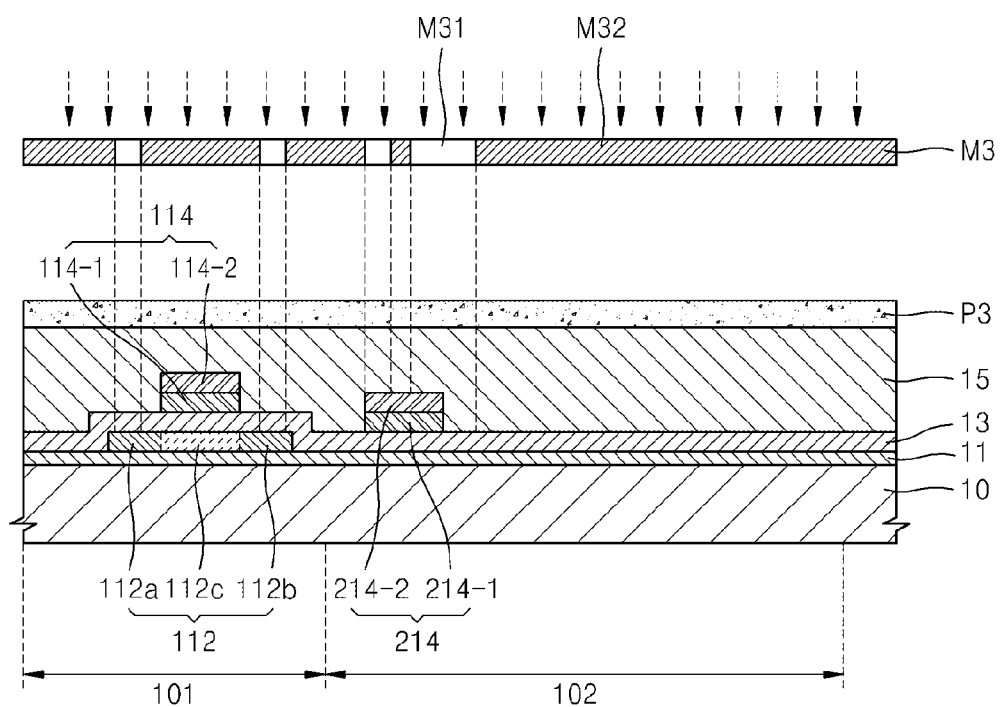

Referring to FIG. 9, a second insulating layer 15 and a third photoresist P3 are applied onto the entire surface of the structure illustrated in FIG. 8 (on which the first insulating layer 13, the gate electrode 114, and the contact portion 214 are formed), and a third mask process using a third photomask M3 that includes a light transmission portion M31 and a light shielding portion M32 is performed.

The second insulating layer 15 is formed of at least one organic insulating material, such as at least one of polyimide, polyamide, acryl resin, benzocyclobutene (BCB), phenol resin, etc., using a coating method, such as spin coating. The second insulating layer 15 is formed to have a sufficient thickness, for example, thicker than the first insulating layer 13 described above, thereby serving as an interlayer dielectric (ILD) layer between the gate electrode 114, the source electrode 116a, and the drain electrode 116b of the thin film transistor TFT. The second insulating layer 15 may also serve as a planarization layer to provide a substantially flat surface for a pixel electrode 27 to be subsequently formed.

The second insulating layer 15 may be formed of an inorganic insulating material, such as at least one of $SiO_2$, $SiN_x$, $Al_2O_3$, $CuO_x$, $Tb_4O_7$, $Y_2O_3$, $Nb_2O_5$, $Pr_2O_3$, in addition to or alternative to the above-described organic insulating material. The second insulating layer 15 may be formed as a single layer or a plurality of layers. The second insulating layer 15 may be formed by alternately using an organic insulating material and an inorganic insulating material.

Figure 10:
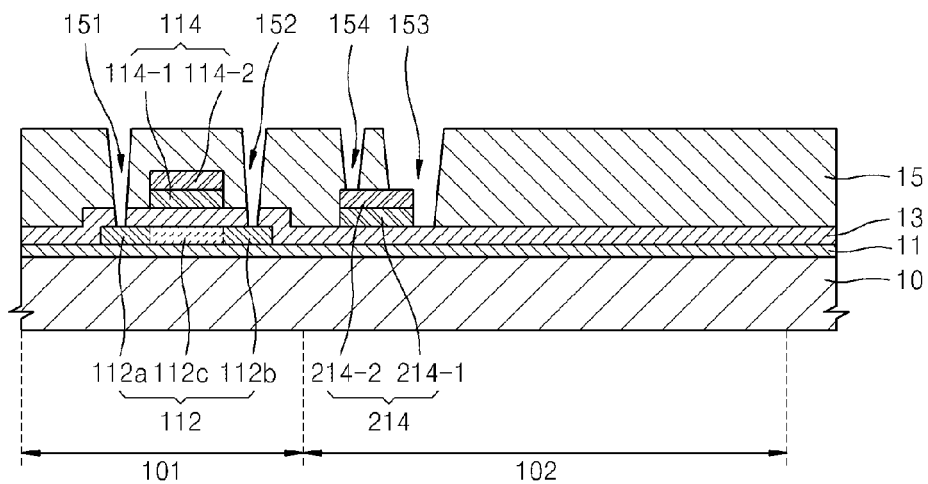

Referring to FIG. 10, as a result of performing the third mask process, the first insulating layer 13 and the second insulating layer 15 are etched so that a first contact hole 151 (through which a portion of the source region 112a is exposed), a second contact hole 152 (through which a portion of the drain region 112b is exposed), and a third contact hole 153 (through which at least a part of the contact portion 214 is exposed) may be formed.

The third contact hole 153 may open at least one edge of the contact portion 214. In an embodiment, the third contact hole 153 may expose at least two edges of the contact portion 214. For example, a width of the third contact hole 153 may be equal to or greater than a width of the contact portion 214.

According to an embodiment of the present invention, in the third mask process, a fourth contact hole 154, through which a portion of the contact portion 214 is exposed, may be formed.

Figure 11:
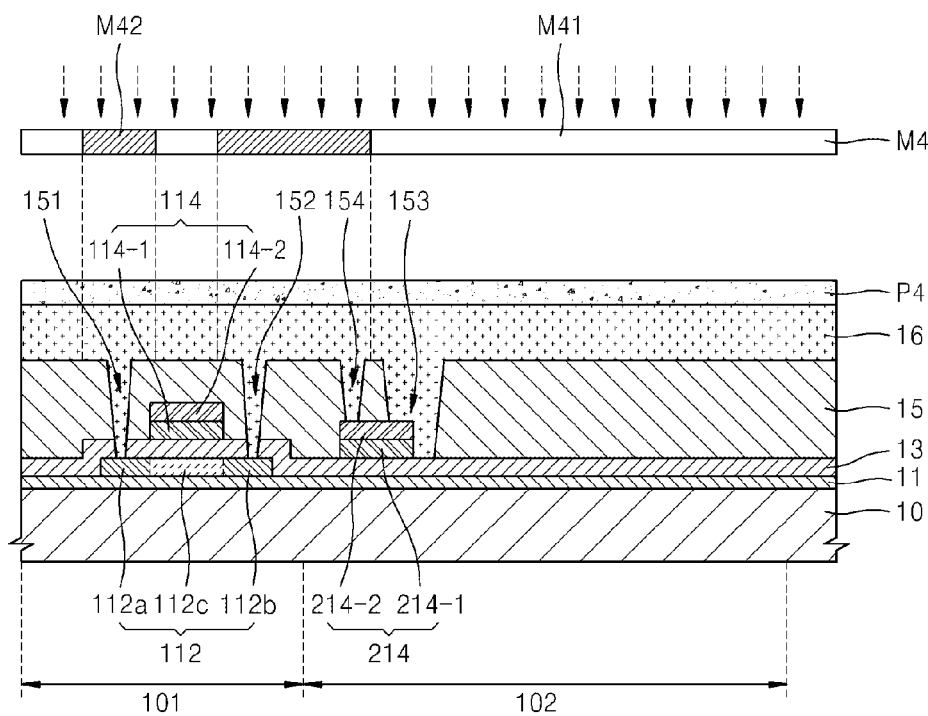

Referring to FIG. 11, a third conductive layer 16 and a fourth photoresist P4 are applied onto the entire surface of the structure illustrated in FIG. 10 (on which the patterned second insulating layer 15 formed using the third mask process is formed), and a fourth mask process is performed by aligning a fourth photomask M4 that includes a light transmission portion M41 and a light shielding portion M42 on the substrate 10.

The third conductive layer 16 may be formed of one or more of various conductive materials. In an embodiment, when the third conductive layer 16 is etched, the second conductive layer 14-2 may also etched together with the third conductive layer 16, but the first conductive layer 14-1 may not be etched. In an embodiment, the third conductive layer 16 may be formed of one or more materials having an etching selectivity that is the same as the etching selectivity of the material(s) of the second conductive layer 14-2 and is substantially different from the etching selectivity of the material(s) of the first conductive layer 14-1. The third conductive layer 16 is deposited to have a sufficient thickness such that the above-described contact holes 151, 152, 153, and 154 may be filled.

The third conductive layer 16 may have a single layer structure that includes at least one of aluminum (Al), platinum (Pt), palladium (Pd), silver (Ag), magnesium (Mg), gold (Au), nickel (Ni), neodymium (Nd), iridium (Ir), chrome (Cr), nickel (Li), calcium (Ca), molybdenum (Mo), titanium (Ti), tungsten (W), copper (Cu), etc. The third conductive layer 16 may have a two-layer structure formed of two low-resistance materials, such as Mo and Al, or Mo and Ag so as to reduce a wiring resistance. The third conductive layer 16 may have a multi-layer structure including two or more layers. For example, third conductive layer 16 may be a stacked structure that consists of an Mo layer, an Al, layer, and an Mo layer; a stacked structure that consists of an MoW layer, an Al—Nd layer, and an MoW layer; a stacked structure that consists of a Ti layer, an Al layer, and a Ti layer; a stacked structure that consists of a Mo layer, an Ag layer, and an Mo layer; or a stacked structure that consists of an Mo layer, an Ag-alloy layer, and an Mo layer.

The fourth photomask M4 includes the light transmission portion M41 and the light shielding portion M42. After the fourth photoresist P4 is exposed and developed using the fourth photomask M4, an etching process is performed using remaining photoresist patterns as a mask.

Figure 12:
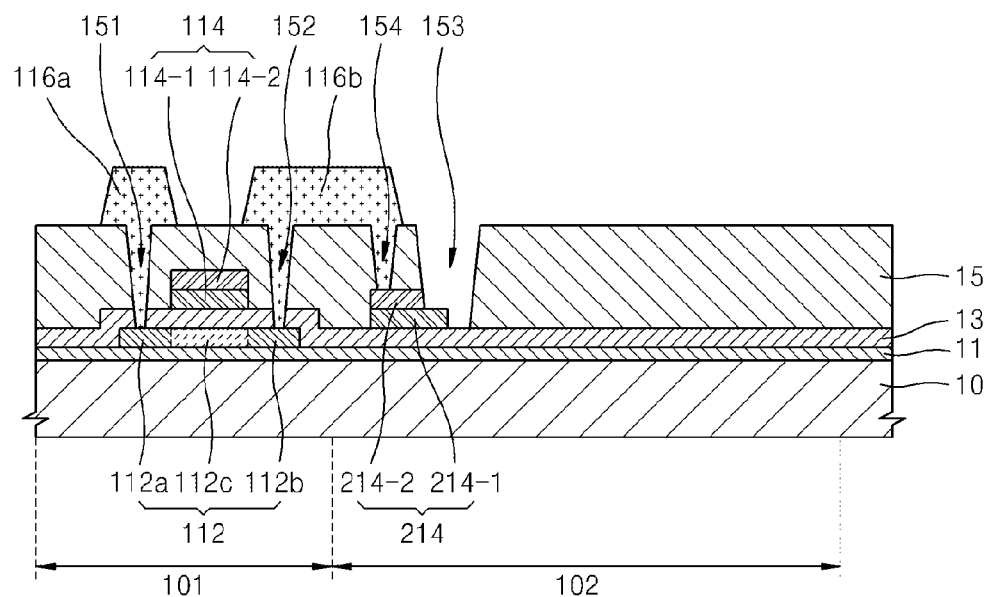

Referring to FIG. 12, as a result of performing the fourth mask process, the third conductive layer 16 is etched so that source electrode 116a and the drain electrode 116b may be formed on the second insulating layer 15 and may contact the source region 112a and the drain region 112b through the contact holes 151 and 152, respectively.

One of the source electrode 116a and the drain electrode 116b may be electrically connected to the contact portion 214. In an embodiment, one (e.g., electrode 116b) of the electrodes 116a and 116b may be formed to contact the contact portion 214 through the fourth contact hole 154. In an embodiment, one (e.g., electrode 116b) of the electrodes 116a and 116b may be formed to contact the second contact layer 214-2 through the fourth contact hole 154.

According to an embodiment of the present invention, the second contact layer 214-2 formed using the second conductive layer 14-2 and illustrated in FIGS. 10 and 11 may be etched together with the third conductive layer 16. For example, as a result of performing the fourth mask process, a part of the second contact layer 214-2 exposed through the third contact hole 153 is removed, and thus a part of the first contact layer 214-1 is exposed through the third contact hole 153.

The etching selectivity of the first conductive layer 14-1 may be different from that of the third conductive layer 16, and the etching selectivity of the second conductive layer 14-2 may be the same as that of the third conductive layer 16. For example, an exposed region of the second contact layer 214-2 disposed below the light transmission portion M41 may be removed together with the third conductive layer 16 using the fourth mask process of etching the third conductive layer 16, and an exposed region of the first contact layer 214-1 that is exposed when a part of the second conductive layer 214-2 is removed may be substantially less etched or may not be substantially etched.

Figure 13:
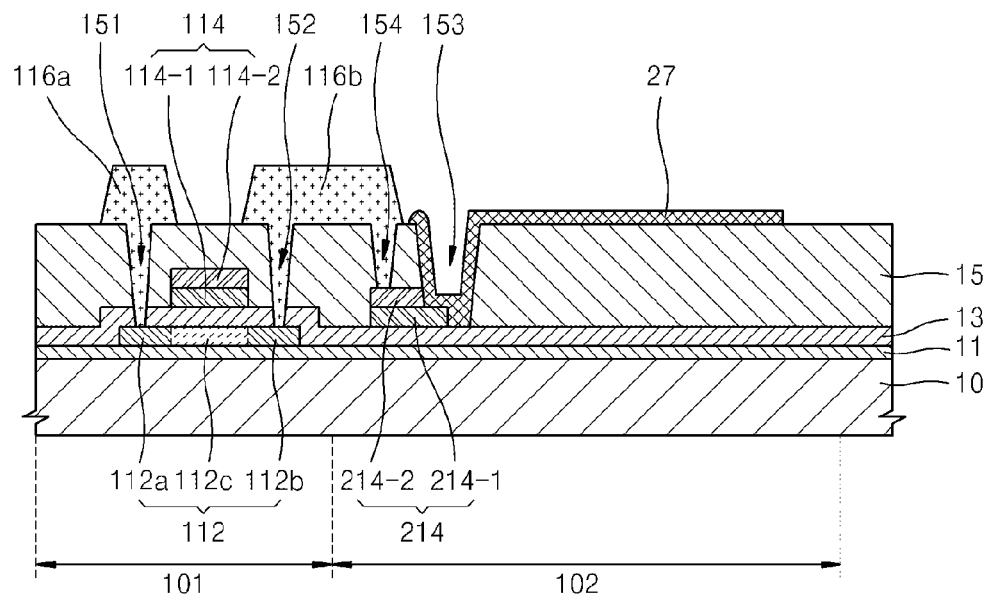

Referring to FIG. 13, the pixel electrode 27 is formed using a fifth mask process that includes forming a fourth conductive layer (not shown) on the structure illustrated in FIG. 12, which has been formed as a result of performing the fourth mask process and of patterning the fourth conductive layer (not shown). The pixel electrode 27 contacts a portion of the first contact layer 214-1 that is exposed through the third contact hole 153.

In FIG. 13, the pixel electrode 27 does not directly contact the drain electrode 116b. In an embodiment, (an end of) the pixel electrode 27 may directly contact the drain electrode 116b.

In an embodiment, the pixel electrode 27 may directly contact one or more edges of one of the source electrode 116a and the drain electrode 116b, wherein the edge(s) of the source electrode 116a or the drain electrode 116b may be disposed between the second insulating layer 15 and (an end portion of) the pixel electrode 27. Advantageously, substantial reliability of connection between the pixel electrode 27 and the thin film transistor TFT may be provided.

In an embodiment, the pixel electrode 27 is electrically connected to the thin film transistor TFT through the contact portion 214 without directly contacting either of the electrodes 116a and 116b.

In an embodiment, the pixel electrode 27 may be formed using only a transparent conductive layer. In an embodiment, the pixel electrode 27 may include a plurality of layers, which may include a semitransparent metal layer disposed on a transparent conductive layer. In an embodiment, the pixel electrode 27 may have a multi-layer structure that includes a metal layer interposed between indium tin oxide (ITO) layers.

The pixel electrode 27 may have a multi-layer structure that includes a reflection conductive layer and/or a semitransparent conductive layer a disposed between two transparent conductive layers. Each of the transparent conductive layers may include one or more of ITO, IZO, ZnO, and $In_2O_3$. The reflection conductive layer and/or the semitransparent conductive layer may include at least one of silver (Ag), a silver alloy, aluminum (Al), and an aluminum alloy. For example, the pixel electrode 27 may have an ITO-Ag-ITO three-layer structure, an ITO-Ag-IZO three-layer structure, an ATD structure (i.e. a structure that includes ITO, Ag alloy, and ITO), and/or an ITO-APC-ITO (wherein APC is an Ag—Pd—Cu alloy). In an embodiment, the pixel electrode 27 may be formed of one or more of various materials and may have a single-layer structure or a multi-layer structure.

The opposite electrode 19 may function as a reflection mirror, and the semitransparent conductive layer (e.g., a semitransparent metal layer) may function as a semitransparent mirror, so that light emitted from an organic light emitting layer may be resonated between the opposite electrode 19 and the semitransparent conductive layer.

Insulating layers disposed between the substrate 10 and the pixel electrode 27, for example, the buffer layer 11, the first insulating layer 13, and the second insulating layer 15, may have different refractive indices between adjacent layers. In an embodiment, insulating layers having different refractive indices are alternately disposed and function as a distributed Bragg reflector (DBR), so that the luminous efficiency of light emitted from an intermediate layer may be optimized.

In addition to the resonance effect provided by the DBR of the buffer layer 11, the first insulating layer 13, and the second insulating layer 15 disposed below the pixel electrode 27, an additional resonance effect is provided by the opposite electrode 19 and the semitransparent conductive layer. Advantageously, satisfactory luminous efficiency of the organic light emitting display apparatus may be provided.

Figure 14:
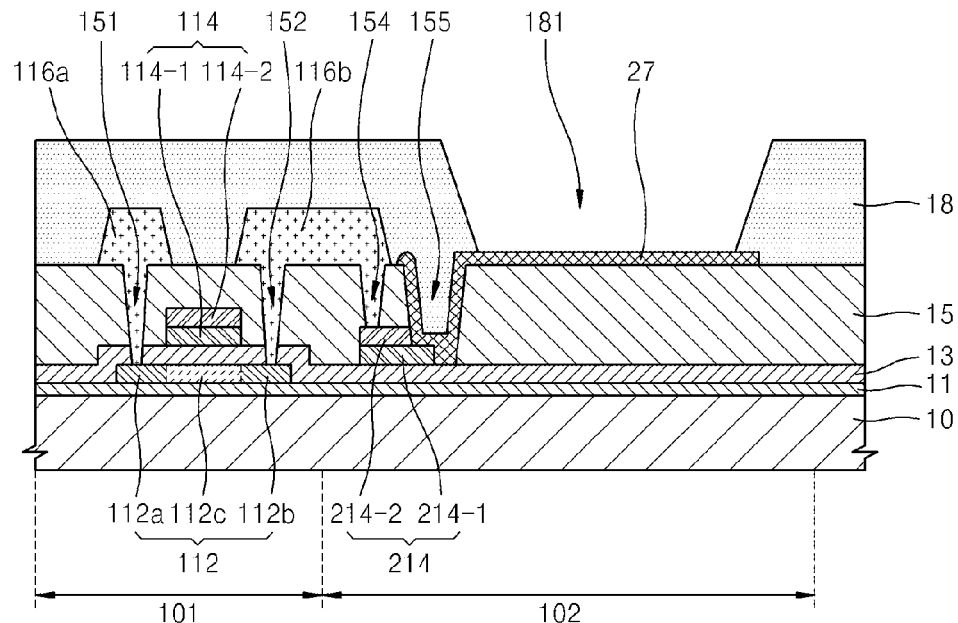

Referring to FIG. 14, a third insulating layer 18 is applied onto the structure illustrated in FIG. 13, which has been formed as a result of performing the fifth mask process. The third insulating layer 18 is patterned through a sixth mask process, for forming an opening 181 through which a portion the pixel electrode 27 is exposed. The opening 181 may expose a portion of the pixel electrode 27 in the light emitting device region 102. Thus, the organic light emitting device EL, which includes the pixel electrode 27, may be formed on the second insulating layer 15 in the light emitting device region 102.

Figure 15:
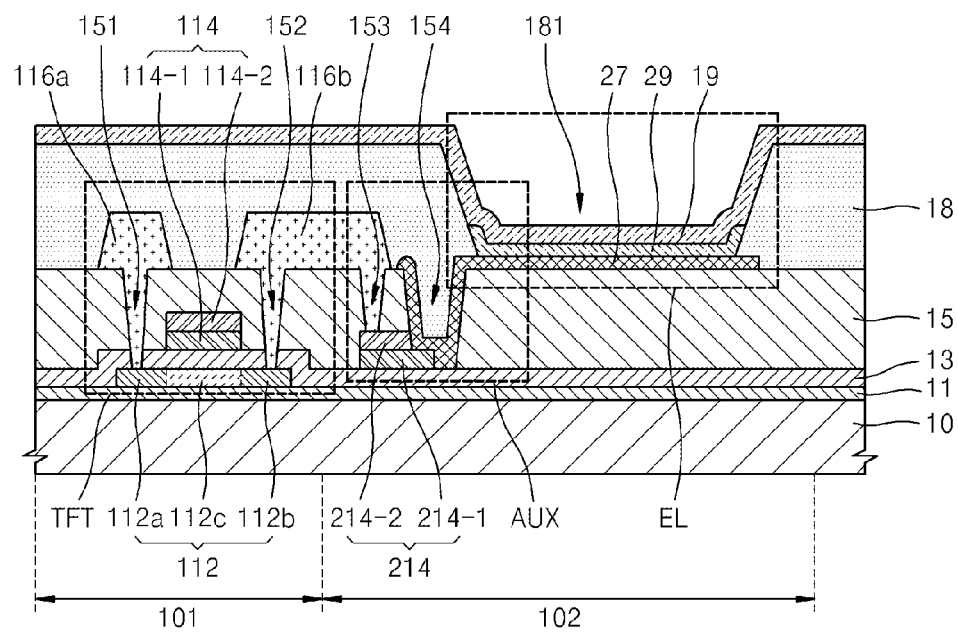

Referring to FIG. 15, an intermediate layer 29 that includes an emissive layer (EML) may be patterned and formed on the portion of the pixel electrode 27 that is exposed through the opening 181, and the opposite electrode 19 may be formed to overlap the pixel electrode 27 with the intermediate layer 29 being disposed between the pixel electrode 27 and the opposite electrode 19.

The intermediate layer 29 may have a single layer structure or a multi-layer structure in which one or more functional layers, such as an emissive layer (EML), a hole transport layer (HTL), a hole injection layer (HIL), an electron transport layer (ETL), and an electron injection layer (EIL), may be stacked. The intermediate layer 29 may be formed of a low molecular organic material or a polymer organic material.

In an embodiment, the intermediate layer 29 may include one or more low molecular organic materials and may have a structure of a hole transport layer (HTL), a hole injection layer (HIL), an electron transport layer (ETL), and an electron injection layer (EIL) disposed on the emissive layer (EML). The intermediate layer 29 may have one or more other layers alternative to or in addition to the above-described layers. The low molecular organic material(s) may include at least one of copper phthalocyanine (CuPc), N'-Di(naphthalene-1-yl)-N, N'-diphenyl-benzidine: (NPB), and tris-8-hydroxyquinoline aluminum (Alq3).

In an embodiment, the intermediate layer 29 may include one or more polymer organic materials and may include an HTL in addition to the EML. The HTL may be formed of poly-(2,4)-ethylene-dihydroxy thiophene (PEDOT) or polyaniline (PANI). The polymer organic material(s) may include one or more of a poly-phenylenevinylene (PPV)-based polymer organic material and a polyfluorene-based polymer organic material.

The opposite electrode 19 may be substantially overlap the entire surface of the substrate 10 and may function as a common electrode. In an embodiment, the pixel electrode 27 is used as an anode, and the opposite electrode 19 is used as a cathode. Polarities of electrodes may be revered.

In an embodiment, the flat panel display apparatus is a bottom emission type, and the opposite electrode 19 may be a reflection electrode that includes a reflection material. For example, the opposite electrode 19 may be formed by depositing a layer formed of one or more metals that have a low work function, for example, one or more of silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), LiF—Ca, LiF—Al, Mg—Ag, etc. The work function is the minimum thermodynamic work (i.e. energy) needed to remove an electron from a solid to a point in the vacuum immediately outside the solid surface. The metal layer may have a minimum thickness.

Although not shown, a sealing member (not shown) and a moisture absorbent (not shown) may be disposed on the opposite electrode 19 so as to protect the intermediate layer 29 from moisture or oxygen.

FIGS. 16A through 16D illustrate examples related to the auxiliary contact unit AUX of the flat panel display apparatus illustrated in FIG. 1.

Figure 16A:
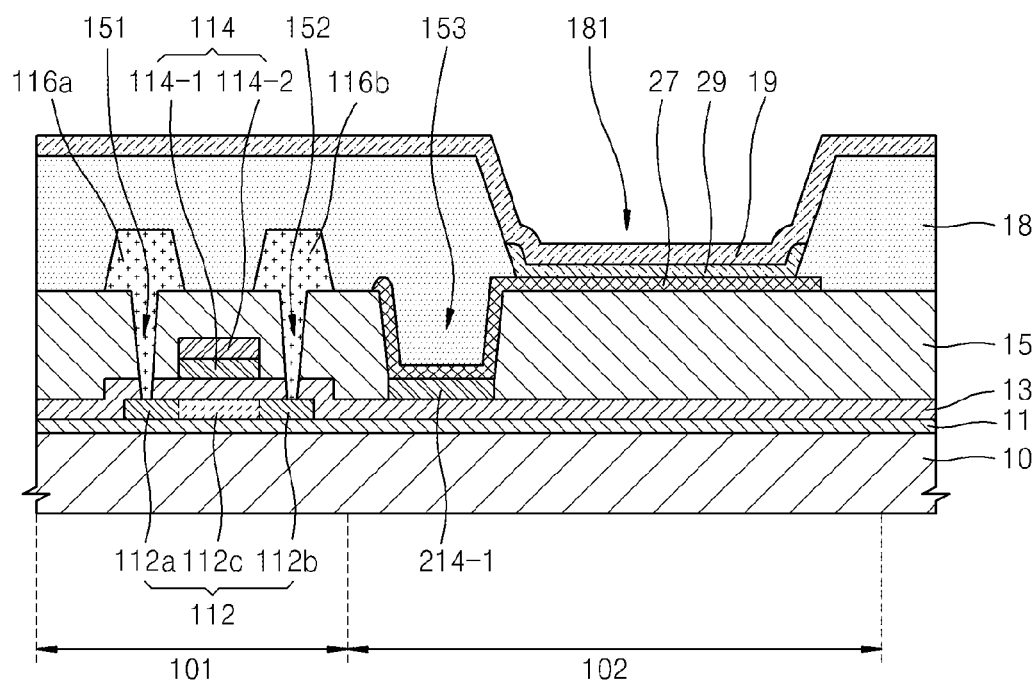
FIGS. 16A through 16D illustrate examples related to an auxiliary contact unit of the flat panel display apparatus illustrated in FIG. 1.

Referring to FIG. 16A, the second insulating layer 15 includes the third contact hole 513 through which the contact portion 214 is exposed, and the second contact layer 214-2 of the contact portion 214 may be exposed through the third contact hole 513 and may be completely removed through the fifth mask process, with the first contact layer 214-1 of the contact portion 214 remaining. Referring to.

FIG. 16A, a width of the third contact hole 513 may be equal to or greater than a width of the contact portion 214, such that the third contact hole 513 may substantially expose at least two edges of the contact portion 214. The pixel electrode 27 may directly contact the first contact layer 214-1 exposed through the third contact hole 513.

Figure 16B:
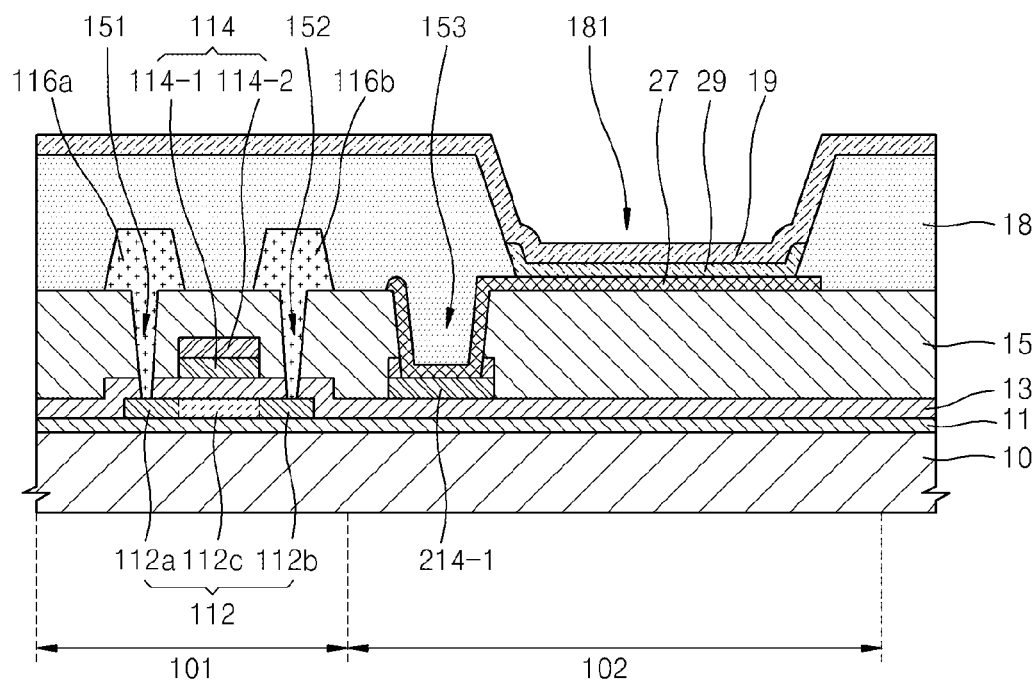

Referring to FIG. 16B, the third contact hole 513 only partially exposes the contact portion 214, and the second insulating layer 15 covers edges of the contact portion 214, so that portions of the second contact layer 214-2 may remain on edges of the first contact layer 214-1. In the auxiliary contact unit AUX illustrated in FIG. 16B, the remaining portions of the second contact layer 214-2 and the exposed portion the first contact layer 214-1 may form a receptacle that receives a portion of the pixel electrode 27 and contacts at least three surfaces (or sides) of the pixel electrode 27. Thus, a stable contact between the pixel electrode 27 and the contact portion 214 may not be formed.

Referring to FIG. 16A and FIG. 16B, the contact portion 214 is electrically connected to the source electrode 116a or the drain electrode 116b. Since FIG. 16A and FIG. 16B are cross-sectional views, connection of the contact portion 214 and the source electrode 116a or the drain electrode 116b may not be illustrated in FIG. 16A and FIG. 16B. For example, the contact portion 214 may be electrically connected to the source electrode 116a or the drain electrode 116b by having a contact point which is located out of the cross-section view of FIG. 16A and FIG. 16B.

Figure 16C:
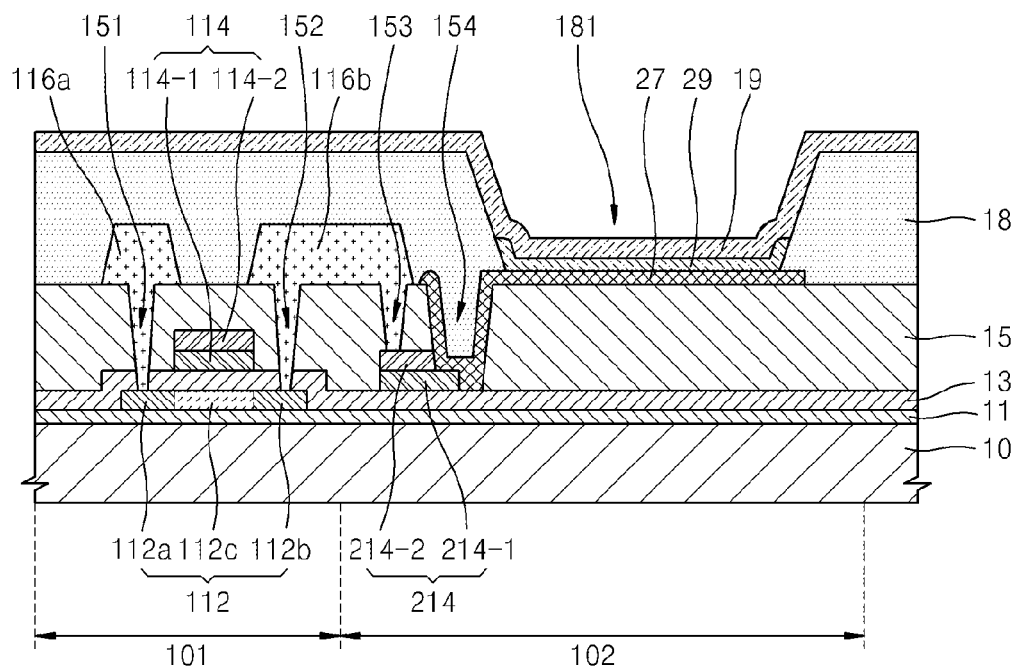

Referring to FIG. 16C, the second insulating layer 15 may further include a fourth contact hole 514. The drain electrode 116b may directly contact a portion of the second contact layer 214-2 that is exposed through the fourth contact hole 514.

The pixel electrode 27 is electrically connected through the contact portion 214 to the source electrode 116a or the drain electrode 116b.

Figure 16D:
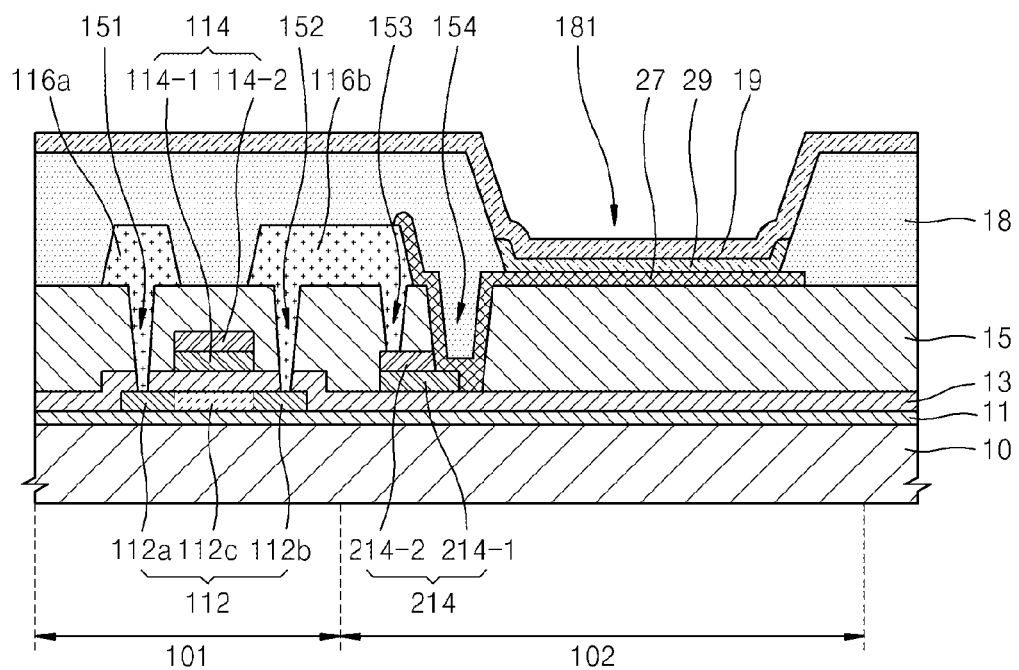

Referring to FIG. 16D, the pixel electrode 27 may cover at least an edge of the drain electrode 116b and may directly contact the drain electrode 116b. The pixel electrode 27 may be indirectly electrically connected to the drain electrode 116b via the contact portion 214. Advantageously, stable and reliable electrical connection between the pixel electrode 27 and the thin film transistor TFT may be provided.

According to the above-described embodiments of the present invention, the pixel electrode 27, the source electrode 116a, and the drain electrode 116b are formed on the second insulating layer 15, and no additional ILD layer between the pixel electrode 27, the source electrode 116a, and the drain electrode 116b is required. Advantageously, no patterning process for additional ILD layers is needed, and the number of mask processes can be minimized.

According to the above-described embodiments of the present invention, a reliable and stable electrical connection between the pixel electrode 27 and the thin film transistor TFT may be provided through at least the contact portion 214. Advantageously, stable and reliable performance of a display apparatus may be ensured.

The contact portion 214 may be formed in the same process and formed on the same layer as the gate electrode 114 of the thin film transistor TFT. Advantageously, mask processes may be minimized. In the above-described embodiments, an organic light emitting display apparatus has been described as an example of the flat panel display apparatus. Embodiments of the invention may be applicable to various display apparatuses, including LCD display apparatuses.

The above-described mask processes are not limited to using photomasks. In an embodiment, a lift-off method may be used, and one or more of various patterning methods may be used. The etching process may be performed using one or more of various methods, such as wet etching and dry etching.

Although one thin film transistor TFT and one light emitting device EL are illustrated as examples in the drawings for describing embodiments of the present invention, embodiments of the invention may include a plurality of thin film transistors TFT and a plurality of light emitting devices EL.

While the invention has been particularly illustrated and described with reference to embodiments thereof, it will be understood by those of ordinary skill in the art that various changes in form and details may be made therein without departing from the spirit and scope of the present invention as defined by the following claims.

What is claimed is:

1. A display apparatus comprising:
a substrate;
an active layer overlapping the substrate and comprising a channel region, a source region, and a drain region;
a first insulating layer disposed on the substrate and the active layer;
a gate electrode disposed on the first insulating layer, overlapping the channel region, and comprising a first gate electrode layer and a second gate electrode layer, wherein the first gate electrode layer is formed of a first material and is disposed between the first insulating layer and the second gate electrode layer, and wherein the second gate electrode layer is formed of a second material that is different from the first material;
a contact portion disposed on the first insulating layer and comprising a first contact layer that is formed of the first material;
a second insulating layer disposed on the gate electrode and the contact portion and comprising a first contact hole, a second contact hole, and a third contact hole, wherein the first contact hole exposes a portion of the source region, wherein the second contact hole exposes a portion of the drain region, and wherein the third contact hole exposes a portion of the first contact layer;

a source electrode formed on the second insulating layer and contacting the source region via the first contact hole;

a drain electrode formed on the second insulating layer and contacting the drain region via the second contact hole; and a pixel electrode formed on the second insulating layer and contacting the first contact layer via the third contact hole.

2. The display apparatus of claim 1, wherein the contact portion further comprises a second contact layer formed of the second material, disposed on the first contact layer, and exposing the portion of the first contact layer.

3. The display apparatus of claim 1, wherein one of the source electrode and the drain electrode is electrically connected to the contact portion.

4. The display apparatus of claim 1, wherein the second insulating layer further comprises a fourth contact hole, the fourth contact hole exposing a portion of the contact portion, and wherein one of the source electrode and the drain electrode contacts the contact portion via the fourth contact hole.

5. The display apparatus of claim 1, wherein a portion of the pixel electrode directly contacts a portion of one of the source electrode and the drain electrode, and wherein the portion of the one of the source electrode and the drain electrode is disposed between the second insulating layer and the portion of the pixel electrode.

6. The display apparatus of claim 5, wherein the pixel electrode directly contacts and covers a side of the one of the source electrode and the drain electrode that is not parallel to a bottom surface of the substrate.

7. The display apparatus of claim 1, further comprising:
a third insulating layer formed on the second insulating layer and comprising an opening through, the opening exposing at least a part of the pixel electrode;
an intermediate layer formed on the part of the pixel electrode and comprising an emissive layer; and
an opposite electrode facing the pixel electrode, wherein the intermediate layer is interposed between the pixel electrode and the opposite electrode.

8. The display apparatus of claim 7, wherein the part of the pixel electrode is disposed between the emissive layer and the second insulating layer.

9. The display apparatus of claim 1, wherein edges of the first gate electrode coincide with edges of the second gate electrode.

10. The display apparatus of claim 1, further comprising a buffer layer formed between the substrate and the active layer.

11. The display apparatus of claim 1, wherein the first contact layer comprises at least one of an indium tin oxide (ITO), an indium zinc oxide (IZO), a zinc oxide (ZnO), an indium oxide ($In_2O_3$), an indium gallium oxide (IGO), and an aluminum zinc oxide (AZO).

12. The display apparatus of claim 1, wherein the active layer is formed of polysilicon.

13. The display apparatus of claim 1, wherein the pixel electrode comprises a metal layer interposed between indium tin oxide (ITO) layers.

14. A method for manufacturing a display apparatus, the method comprising:
forming a semiconductor layer that overlaps a substrate;
forming an active layer by patterning the semiconductor layer;
sequentially forming a first insulating layer, a first conductive layer, and a second conductive layer that overlap the active layer and the substrate, wherein in the first conductive layer is formed of a first material, and wherein the second conductive layer is formed of a second material that is different from the first material;
simultaneously patterning the first conductive layer and the second conductive layer to form a gate electrode and a contact portion that is spaced from the gate electrode, wherein the gate electrode comprises a first gate electrode layer and a second gate electrode layer, wherein the contact portion comprises a first contact layer and a second contact layer, wherein the first gate electrode layer and the first contact layer are formed of the first material, and wherein the second gate electrode layer and the second contact layer are formed of the second material;
using the gate electrode as a mask to form a source region and a drain region at edges of the active layer;
forming a second insulating layer that overlaps the gate electrode, the contact portion, and the first insulating layer;
patterning the second insulating layer to form a first contact hole, a second contact hole, and a third contact hole, wherein the first contact hole exposes a portion of the source region, wherein the second contact hole exposes a portion of the drain region, and wherein the third contact hole exposes at least a part of the contact portion;
forming a third conductive layer that overlaps the second insulating layer;
patterning the third conductive layer to form a source electrode that contacts the source region through the first contact hole and to form a drain electrode that contacts the drain region through the second contact hole;
forming a fourth conductive layer that overlaps the second insulating layer; and
patterning the fourth conductive layer to form a pixel electrode.

15. The method of claim 14, further comprising removing at least a part of the second contact layer during the patterning the third conductive layer to expose at least a portion of the first contact layer, wherein the pixel electrode directly contacts the portion of the first contact layer through the third contact hole.

16. The method of claim 14, wherein the third contact hole exposes at least one edge of the contact portion.

17. The method of claim 14, further comprising forming a buffer layer on the substrate.

18. The method of claim 14, wherein one of the source electrode and the drain electrode is electrically connected to the contact portion.

19. The method of claim 14, wherein the patterning the second insulating layer comprises forming a fourth contact hole that exposes a portion of the second contact layer, and wherein one of the source electrode and the drain electrode contacts the second contact layer via the fourth contact hole.

20. The method of claim 14, wherein a portion of the pixel electrode directly contacts a portion of one of the source electrode and the drain electrode, and wherein the portion of the one of the source electrode and the drain electrode is disposed between the second insulating layer and the portion of the pixel electrode.

21. The method of claim 20, wherein the pixel electrode directly contacts and covers a side of the one of the source electrode and the drain electrode that is not parallel to a bottom surface of the substrate.

22. The method of claim 14, further comprising:
forming a third insulating layer that overlaps the pixel electrode; and
patterning the third insulating layer to form an opening that exposes a part of the pixel electrode is exposed.

23. The method of claim 22, further comprising:
forming an intermediate layer comprising an emissive layer on the part of the pixel electrode; and
forming an opposite electrode that overlaps the pixel electrode, wherein the intermediate layer is interposed between the pixel electrode and the opposite electrode.

24. The method of claim 22, wherein the part of the pixel electrode is disposed between the emissive layer and the second insulating layer.

25. The method of claim 14, wherein edges of the first gate electrode coincide with edges of the second gate electrode.

26. The method of claim 14, wherein the first conductive layer comprises at least one of an indium tin oxide (ITO), an indium zinc oxide (IZO), a zinc oxide (ZnO), an indium oxide ($In_2O_3$), an indium gallium oxide (IGO), and an aluminum zinc oxide (AZO).

27. The method of claim 14, wherein the fourth conductive layer comprises a metal layer interposed between indium tin oxide (ITO) layers.

28. A display apparatus comprising:
a substrate;
an active layer overlapping the substrate and comprising a channel region, a source region, and a drain region;
a first insulating layer disposed on the substrate and the active layer;
a gate electrode disposed on the first insulating layer, overlapping the channel region, and comprising a first gate electrode layer and a second gate electrode layer, wherein the first gate electrode layer is formed of a first material and is disposed between the first insulating layer and the second gate electrode layer, and wherein the second gate electrode layer is formed of a second material that is different from the first material;
a contact portion disposed on the first insulating layer and comprising a first contact layer that is formed of the first material;
a second insulating layer disposed on the gate electrode and the contact portion and comprising a first contact hole, a second contact hole, and a third contact hole, wherein the first contact hole exposes a portion of the source region, wherein the second contact hole exposes a portion of the drain region, and wherein the third contact hole exposes a portion of the first contact layer;
a source electrode formed on the second insulating layer and contacting the source region via the first contact hole;
a drain electrode formed on the second insulating layer and contacting the drain region via the second contact hole; and
a pixel electrode formed on the second insulating layer and contacting the first contact layer via the third contact hole, wherein a material of the pixel electrode is different from a material of the drain electrode.

29. The display apparatus of claim 1, wherein at least one edge of the contact portion is exposed by the third contact hole.

* * * * *